(12) United States Patent
Mochizuki

(10) Patent No.: US 8,315,286 B2
(45) Date of Patent: Nov. 20, 2012

(54) LIGHT EMITTING DEVICE

(75) Inventor: Masamitsu Mochizuki, Suwa (JP)

(73) Assignee: Seiko Epson Corporation (JP)

( * ) Notice: Subject to any disclaimer, the term of this patent is extended or adjusted under 35 U.S.C. 154(b) by 136 days.

(21) Appl. No.: 12/819,255

(22) Filed: Jun. 21, 2010

(65) Prior Publication Data

US 2010/0322278 A1    Dec. 23, 2010

(30) Foreign Application Priority Data

Jun. 23, 2009  (JP) .................................. 2009-148611

(51) Int. Cl.
*H01S 5/00*  (2006.01)
(52) U.S. Cl. .................................................. 372/45.01
(58) Field of Classification Search ............... 372/45.01
See application file for complete search history.

(56) References Cited

U.S. PATENT DOCUMENTS

| | | | | |
|---|---|---|---|---|
| 5,088,105 A | * | 2/1992 | Scifres et al. | 372/92 |
| 2003/0160254 A1 | * | 8/2003 | Henrichs | 257/88 |

FOREIGN PATENT DOCUMENTS

JP    11-64789    3/1999

* cited by examiner

*Primary Examiner* — Patrick Stafford
(74) *Attorney, Agent, or Firm* — Harness, Dickey & Pierce, P.L.C.

(57) ABSTRACT

A light emitting device includes: a single crystal substrate having a plane tilted from a low-index plane and first and second cladding layers sandwiching an active layer, wherein the active layer includes first and second parallel side surfaces, part of the active layer constitutes first and second gain regions, a first side surface reflectance is higher than a second side surface reflectance, each of the first and second gain regions is disposed from a first side surface end surface to a second side surface end surface, the first gain region end surface partially overlaps the second gain region end surface so the end surfaces do not overlap each other in the first and second gain regions, a perpendicular of the first side surface is parallel to an off-direction of the substrate, and the first and second gain regions have equal lengths.

9 Claims, 8 Drawing Sheets

LIGHT EMITTING DEVICE

BACKGROUND

1. Technical Field

The present invention relates to a light emitting device.

2. Related Art

In recent years, a high-intensity laser device superior in color reproducibility has become a promising light emitting device for a light source of a display device such as a projector or a monitor display. However, in some cases, there might arise a problem of a speckle noise caused by scattered light from a screen surface interfering with each other. To cope with this problem, for example, there has been proposed in JP-A-11-64789 a method of fluctuating the screen to vary the speckle pattern for reducing the speckle noise.

However, according to the method disclosed in the document mentioned above, there might arise another problem that the screen is limited, that an additional member for moving the screen such as a motor is required, or that a noisy sound is caused by the motor or the like.

Further, it is also possible to use an ordinary light emitting diode (LED) for the light source in order to reduce the speckle noise. However, there might be the case which the LED fails to provide a sufficient output power.

SUMMARY

An advantage of some aspects of the invention is to provide a novel light emitting device capable of reducing the speckle noise and providing a high output power.

According to an aspect of the invention, there is provided a light emitting device including a substrate formed of a single crystal having a zinc blende structure, and having a plane tilted at a predetermined angle from a low-index plane as a principal surface, a first cladding layer formed above the principal surface, an active layer formed above the first cladding layer, and a second cladding layer formed above the active layer, wherein the active layer includes a first side surface and a second side surface parallel to the first side surface, at least part of the active layer constitutes a first gain region and a second gain region, a reflectance of the first side surface is higher than a reflectance of the second side surface at a wavelength region of light generated in the first gain region and the second gain region, each of the first gain region and the second gain region is disposed from an end surface on the first side surface to an end surface on the second side surface, at least part of the end surface of the first gain region located on the first side surface and part of the end surface of the second gain region located on the first side surface overlap with each other, the end surface on the first side surface and the end surface on the second side surface fail to overlap with each other in a plan view from the first side surface side in each of the first gain region and the second gain region, a perpendicular of the first side surface is parallel to an off-direction of the substrate in a plan view, and a length of the first gain region and a length of the second gain region are equal to each other.

According to such a light emitting device, the laser oscillation of the light generated in the gain regions can be suppressed or prevented, thus the speckle noise can be reduced.

It should be noted that in the descriptions related to the invention, the term "above" is used in such a phrase as "a specific object (hereinafter referred to as "B") is formed "above" another specific object (hereinafter referred to as "A")." In the descriptions related to the invention, in such a case as this example, the term "above" is used in order to include the case of forming B directly on A and the case of forming B on A via something else. Similarly, it is assumed that the term "under" is used in order to include the case of forming B directly on the lower surface of A and the case of forming B under A via something else.

According to another aspect of the invention, in the light emitting device of the above aspect of the invention, it is also possible that an amount of an angle of the first gain region with respect to the off-direction and an amount of angle of the second gain region with respect to the off-direction are equal to each other in a plan view.

According to such a light emitting device, it is possible that the intensity of light emitted from the end surface of the first gain region on the second side surface is identical to that emitted from the end surface of the second gain region on the second side surface. Therefore, in the case of using the light emitting device for, for example, a light source of a projector or a monitor display, the luminance variation on a screen or a display surface can be reduced.

According to still another aspect of the invention, in the light emitting device of the above aspect of the invention, it is also possible that the first gain region has a reflection surface adapted to reflect light proceeding through the first gain region, and disposed between the first side surface and the second side surface, and light emitted from the end surface of the first gain region located on the second side surface and light emitted from the end surface of the second gain region on the second side surface proceed toward the same direction.

According to such a light emitting device, the optical system on which the emitted light incidents can be downsized.

According to yet another aspect of the invention, in the light emitting device of the above aspect of the invention, it is also possible that the reflection surface is disposed on a third side surface of the active layer perpendicular to the first side surface and the second side surface, the first gain region has a first part disposed from the first side surface to the third side surface and a second part disposed from the third side surface to the second side surface, and an angle of the first part with respect to the perpendicular of the first side surface, an angle of the second part with respect to the perpendicular of the first side surface, and an angle of the second gain region with respect to the perpendicular of the first side surface are the same in a plan view.

According to such a light emitting device, it is possible that the intensity of light emitted from the end surface of the first gain region on the second side surface is identical to that of the light emitted from the end surface of the second gain region on the second side surface. Further, the optical system on which the emitted light incidents can be downsized.

According to still yet another aspect of the invention, there is provided a light emitting device including a substrate formed of a single crystal having a zinc blende structure, and having a plane tilted at a predetermined angle from a low-index plane as a principal surface, a first cladding layer formed above the principal surface, an active layer formed above the first cladding layer, and a second cladding layer formed above the active layer, wherein the active layer includes a first side surface and a second side surface parallel to the first side surface, at least part of the active layer constitutes a first gain region and a second gain region, a reflectance of the first side surface is higher than a reflectance of the second side surface in a wavelength region of light generated in the first gain region and the second gain region, each of the first gain region and the second gain region is disposed from an end surface on the first side surface to an end surface on the second side surface, at least part of the end surface of the first gain region located on the first side surface and part of the end surface of the second gain region located on the first side surface overlap with each other, the end surface on the first side surface and the end surface on the second side surface fail to overlap with each other in a plan view from the first side surface side in each of the first gain region and the second gain region, a perpendicular of the first side surface is parallel to an off-direction of the substrate in a plan view, and the second gain region includes a first gain portion having a tilt amount equal to an amount of tilt of the first gain region with respect to the off-direction in a plan view, and a second gain portion having a tilt amount different from the amount of tilt of the first gain region with respect to the off-direction in a plan view, and a length of the first gain portion is larger than a length of the second gain portion.

According to such a light emitting device, the laser oscillation of the light generated in the gain regions can be suppressed or prevented, thus the speckle noise can be reduced.

According to further another aspect of the invention, in the light emitting device of the above aspect of the invention, it is also possible that the first gain region has a linear shape in a plan view, the second gain region includes a curved gain section, and light emitted from the end surface of the first gain region located on the second side surface and light emitted from the end surface of the second gain region on the second side surface proceed toward the same or converging direction.

According to such a light emitting device, it is possible that the light emitted from the end surface of the first gain region on the second side surface and the light emitted from the end surface of the second gain region on the second side surface proceed in the same or converging direction without using the reflection surface formed on the side surface of the active layer by using a cleavage or an etching process. Therefore, the optical system on which the emitted light incidents can be downsized.

According to still further another aspect of the invention, in the light emitting device of the above aspect of the invention, it is also possible that a first electrode electrically connected to the first cladding layer, and a second electrode electrically connected to the second cladding layer are further provided, the first electrode is contact with a first layer having ohmic contact with the first electrode, the second electrode is contact with a second layer having ohmic contact with the second electrode, and at least one of a contact surface between the first electrode and the first layer and a contact surface between the second electrode and the second layer has a planar shape the same as a planar shape of the first gain region and the second gain region.

According to such a light emitting device, the contact resistance of the first electrode and the second electrode can be reduced using the first and the second layer.

It should be noted that in the descriptions related to the invention, the term "electrically connected" is used in such a phrase as "a specific member (hereinafter referred to as a "member D") is "electrically connected" to another specific member (hereinafter referred to as a "member C")." In the descriptions related to the invention, in such a case as this example, the term "electrically connected" is used in order to include the case which the member C and the member D are electrically connected while being direct contact with each other and the case which the member C and the member D are electrically connected via another member.

According to yet further another aspect of the invention, in the light emitting device of the above aspect of the invention, it is also possible that the first gain region and the second gain region form a pair of gain regions, and a plurality of pairs of gain regions is disposed.

According to such a light emitting device, higher output power can be achieved.

BRIEF DESCRIPTION OF THE DRAWINGS

The invention will be described with reference to the accompanying drawings, wherein like numbers reference like elements.

DESCRIPTION OF AN EXEMPLARY EMBODIMENT

An exemplary embodiment of the invention will be described hereinafter with reference to the accompanying drawings.

1. Light Emitting Device

Figure 1:
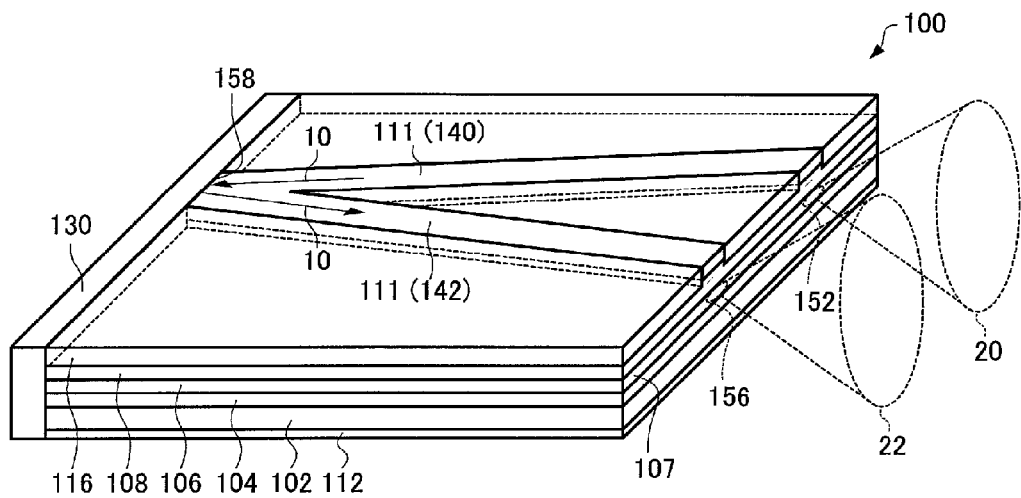
FIG. 1 is a perspective view schematically showing a light emitting device according to the present embodiment.
Figure 2:
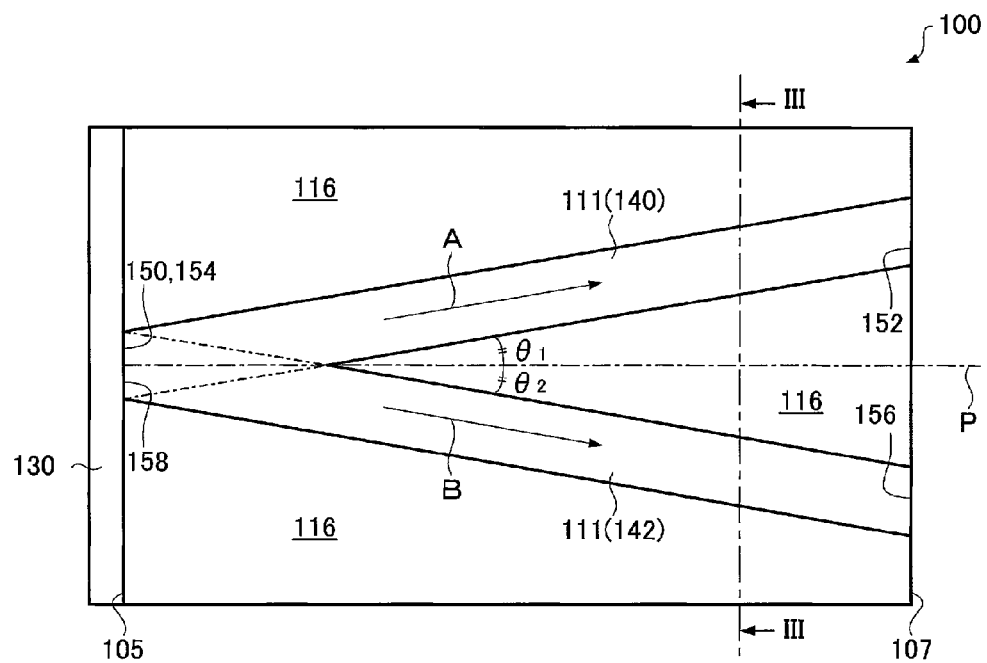
FIG. 2 is a plan view schematically showing the light emitting device according to the present embodiment.
Figure 3:
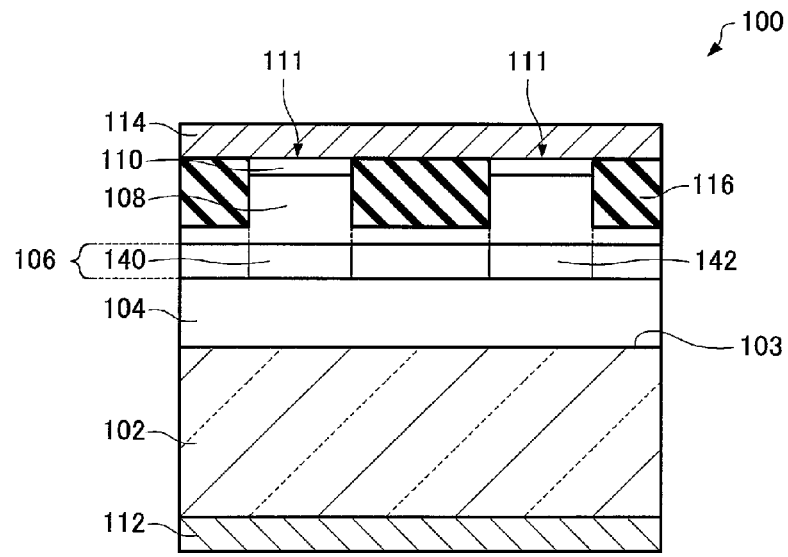
FIG. 3 is a cross-sectional view schematically showing the light emitting device according to the present embodiment.

Firstly, the light emitting device according to the present embodiment will be explained. FIG. 1 is a perspective view schematically showing the light emitting device 100 according to the present embodiment. FIG. 2 is a plan view schematically showing the light emitting device 100 according to the present embodiment. FIG. 3 is a cross-sectional view schematically showing the light emitting device 100 according to the present embodiment, which corresponds to a cross-sectional view along the III-III line shown in FIG. 2. It should be noted that in FIGS. 1 and 2, a second electrode 114 is omitted from illustration for the sake of convenience. Further, the case which the light emitting device 100 is an InGaAlP type (red) semiconductor light emitting device will be explained here.

As shown in FIGS. 1 and 3, the light emitting device 100 includes a substrate 102, a first cladding layer 104, an active layer 106, and a second cladding layer 108. The light emitting device 100 can further include a contact layer 110, an insulating layer 116, a first electrode 112, and a second electrode 114.

As the substrate 102, a substrate made of a zinc blende type single crystal can be used. As the substrate 102, a first conductivity type (e.g., n-type) GaAs substrate, for example, can be used. The substrate 102 can be an off-substrate having a surface tilted at a predetermined angle from (100) plane in [010] direction as the principal surface, for example. It should be noted that it is assumed that if an index number is negative, the index number is described with a minus sign placed in front of the index number for the sake of convenience of description, and except the notation system regarding the negative index number, a typical notation system of Miller index is adopted. The principal surface 103 is not limited to a plane tilted from the (100) plane, but any planes tilted from a low-index plane can be adopted. The low-index plane denotes, for example, a plane expressed by (abc) plane (where a through c are each 0 or 1). Since the substrate 102 is a off-substrate, it is possible to obtain a preferable epitaxially-grown film on the principal surface 103.

The first cladding layer 104 is formed on the principal surface 103 of the substrate 102. As the first cladding layer 104, an n-type InGaAlP layer, for example, can be used. It should be noted that although not shown in the drawings, it is also possible to form a buffer layer between the substrate 102 and the first cladding layer 104. As the buffer layer, an n-type GaAs layer, an n-type InGaP layer, and so on can be used.

The active layer 106 is formed on the first cladding layer 104. The active layer 106 has, for example, a multiple quantum well (MQW) structure obtained by stacking three quantum well structures each composed of an InGaP well layer and an InGaAlP barrier layer, and an InGaAlP guiding layer.

Some parts of the active layer 106 constitute a plurality of gain regions. In the example shown in the drawing, parts of the active layer 106 constitute a first gain region 140 and a second gain region 142. In the example shown in the drawing, the first gain region 140 and the second gain region 142 constitute a pair of gain regions. The first gain region 140 and the second gain region 142 are each disposed in a line. The planar shape of each of the first and the second gain region 140, 142 is, for example, a parallelogram as shown in FIG. 2.

It is possible to generate light in the gain regions 140, 142, and the light can be provided with gains inside the gain regions 140, 142. As shown in FIG. 2, the active layer 106 has a first side surface 105 and a second side surface 107. The first side surface 105 and the second side surface 107 are parallel to each other. For example, the first side surface 105 can be a (0-10) plane, and the second side surface 107 can be a (010) plane. In the (100) GaAs substrate, the (0-10) plane and the (010) plane are planes which can form cleavage planes. Therefore, it is possible to make the side surfaces 105, 107 of the active layer 106 the cleavage planes. The cleavage planes are planes which are flat at the atomic level, and it is therefore possible, for example, to preferably emit the light generated in the gain regions 140, 142 from the end surfaces 152, 156 on the second side surface 107, and to preferably reflect it on the end surfaces 150, 154 on the first side surface 105. The first side surface 105 and the second side surface 107 can also be formed by etching. This method is particularly effective in the case that the angles of the (0-10) plane and the (010) plane with respect to a plane parallel to the active layer 106 are large, and the light proceeding through the gain regions 140, 142 satisfies the total reflection condition if the (0-10) plane and the (010) plane are used.

In the wavelength region of the light generated in the gain regions 140, 142, the reflectance of the first side surface 105 is higher than that of the second side surface 107. For example, as shown in FIGS. 1 and 2, the high reflectance can be obtained by covering the first side surface 105 with a reflective section 130. The reflective section 130 has a high reflective structure such as a dielectric mirror or a metallic mirror. More specifically, as the reflective section 130, it is possible to use, for example, a mirror having 4 pairs of layers of SiON and SiN stacked in this order from the first side surface 105. It is preferable that the reflectance of the first side surface 105 is 100% or approximately 100%. In contrast thereto, it is preferable that the reflectance of the second side surface 107 is 0% or approximately 0%. For example, by covering the second side surface 107 with an antireflective section (not shown), it is possible to obtain low reflectance. As the antireflective section, a single layer of $Al_2O_3$, for example, can be used. It should be noted that the reflective section 130 and the antireflective section are not limited to the examples described above, but also an $SiO_2$ layer, an SiN layer, an SiON layer, a $Ta_2O_5$ layer, a $TiO_2$ layer, a TiN layer, and a multilayer of them, for example, can be used as these sections.

Each of the gain regions 140, 142 is disposed from the first side surface 105 to the second side surface 107 in a direction tilted with respect to the perpendicular P of the first side surface 105 in a plan view shown in FIG. 2. In other words, it can also be said that each of the gain regions 140, 142 is disposed from the first side surface 105 to the second side surface 107 in a direction tilted with respect to the line (a perpendicular P) perpendicular to an intersection line of the first side surface 105 and the upper surface of the active layer 106 in a plan view shown in FIG. 2. Thus, the laser oscillation of the light generated in the gain regions 140, 142 can be suppressed or prevented. The perpendicular P is parallel to, for example, the off-direction of the substrate 102 in a plan view. In other words, in a plan view, the perpendicular P and a straight line along the off-direction are, for example, parallel to each other. Here, in the case of, for example, the substrate having a plane tilted at a predetermined angle from the (100) plane in the [010] direction as the principal surface, the off-direction can be a direction defined by orthographically projecting the [100] direction with respect to the principal surface of the substrate. In the example shown in FIG. 2, the off-direction can be a direction identical to the [010] direction of the substrate 102 in a plan view, for example. The first gain region 140 and the second gain region 142 are disposed in the directions different from each other. In the example shown in the drawing, the first gain region 140 is disposed in the first direction A tilted toward one side at an angle θ1 with respect to the perpendicular P. The second gain region 142 is disposed in the second direction B tilted toward the other side (the side opposite to the one side) at an angle $θ_2$ with respect to the perpendicular P. It should be noted that the case which the first gain region is disposed in a predetermined direction can denote, for example, the case which it is disposed in a direction of a straight line connecting the center of the first end surface 150 on the first side surface 105 and the center of the second end surface 152 on the second side surface 107. This can be applied to other gain regions. In the example shown in the drawings, the angle $θ_1$ and the angle $θ_2$ are the same amount. It should be noted that in the present embodiment of the invention, when using the term "angle", if the "angle" may correspond to both of an acute angle and an obtuse angle, the "angle" is assumed to correspond to the acute angle.

The first gain region 140 has the first end surface 150 on the first side surface 105 and the second end surface 152 on the second side surface 107. The second gain region 142 has the third end surface 154 on the first side surface 105 and the fourth end surface 156 on the second side surface 107. In the example shown in the drawing, the first end surface 150 and the third end surface 154 completely overlap with each other in an overlapping plane 158. It is also possible that part of the first end surface 150 and part of the third end surface 154 overlap with each other in the overlapping plane 158. The planar shape of the first and the second gain regions 140, 142 can be axisymmetrical with each other about, for example, the perpendicular P. The planar shape of the first and the second gain regions 140, 142 can be axisymmetrical with each other about, for example, a perpendicular bisector P of the overlapping plane 158.

In the example shown in the drawing, the length of the first and the second gain regions 140, 142 are equal to each other. In other words, the light path length of the light proceeding through the first gain region 140 and that of the light proceeding through the second gain region 142 are, for example, equal to each other. Here, the length of the first gain region 140 can denote, for example, the length of a line connecting the center of the first end surface 150 on the first side surface 105 and the center of the second end surface 152 on the second side surface 107 along with the first gain region 140 in a plan view. It should be noted that the same can be applied to the second gain region 142.

Figure 5:
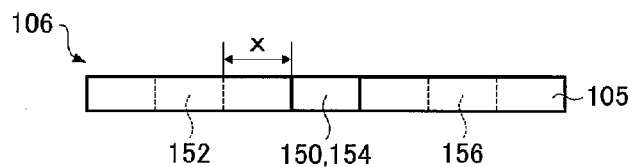
FIG. 5 is a diagram of an active layer of the light emitting device according to the present embodiment viewed from a first side surface side in a planar manner.

FIG. 5 is a diagram of the active layer 106 viewed from the side of the first side surface 105 in a planar manner. As shown in FIG. 5, in each of the first gain region 140 and the second gain region 142, the end surfaces 150, 154 on the first side surface 105 and the end surfaces 152, 156 on the second side surface 107 do not overlap with each other. Thus, it is possible to prevent the light generated in the gain regions 140, 142 from causing direct multiple reflections between the end surfaces 150, 154 on the first side surface 105 and the end surfaces 152, 156 on the second side surface 107. As a result, since it is possible to prevent constitution of the direct resonator, it becomes possible more reliably to suppress or prevent the laser oscillation of the light generated in the gain regions 140, 142. Therefore, the light emitting device 100 can emit non-laser light. In the case shown in FIG. 5, in the example of the first gain region 140, it is sufficient that the shift width x between the first end surface 150 and the second end surface 152 takes a positive value.

The second cladding layer 108 is formed on the active layer 106. The second cladding layer 108 is made of, for example, a second conductive type (e.g., a p-type) semiconductor. As the second cladding layer 108, a p-type InGaAlP layer, for example, can be used.

A pin diode is composed of the p-type second cladding layer 108, the active layer 106 with no impurity doped, and the n-type first cladding layer 104. Each of the first and the second cladding layer 104, 108 has a forbidden band width larger than that of the active layer 106 and a refractive index smaller than that of the active layer 106. The active layer 106 has a function of amplifying the light. The first and the second cladding layers 104, 108 sandwiching the active layer 106 have a function of confining injected carriers (electrons and holes) and the light in the active layer 106.

In the light emitting device 100, when applying a forward bias voltage of the pin diode between a first electrode 112 and a second electrode 114, there occurs recombination of electrons and holes in the gain regions 140, 142 of the active layer 106. The recombination causes a spontaneous emission of light. Originating from the spontaneous emission, the stimulated emission occurs in a chained manner, and the intensity of light is amplified inside the gain regions 140, 142. For example, as shown in FIG. 1, part of the light 10 generated in the first gain region 140 is amplified inside the first gain region 140, then reflected at the overlapping plane 158, and then emitted from the fourth end surface 156 of the second gain region 142 as second emitted light 22. In this case, the intensity of the light 10 is also amplified inside the second gain region 142 after the reflection. Similarly, part of the light generated in the second gain region 142 is amplified inside the second gain region 142, then reflected at the overlapping plane 158, and then emitted from the second end surface 152 of the first gain region 140 as first emitted light 20. In this case, the intensity of the light is also amplified inside the first gain region 140 after the reflection. It should be noted that some of the light generated in the first gain region 140 is emitted directly from the second end surface 152 as the first emitted light 20. Similarly, some of the light generated in the second gain region 142 is emitted directly from the fourth end surface 156 as the second emitted light 22. The intensity of such light is also amplified inside the respective gain regions 140, 142 in the similar manner.

Figures 4A, 4B:
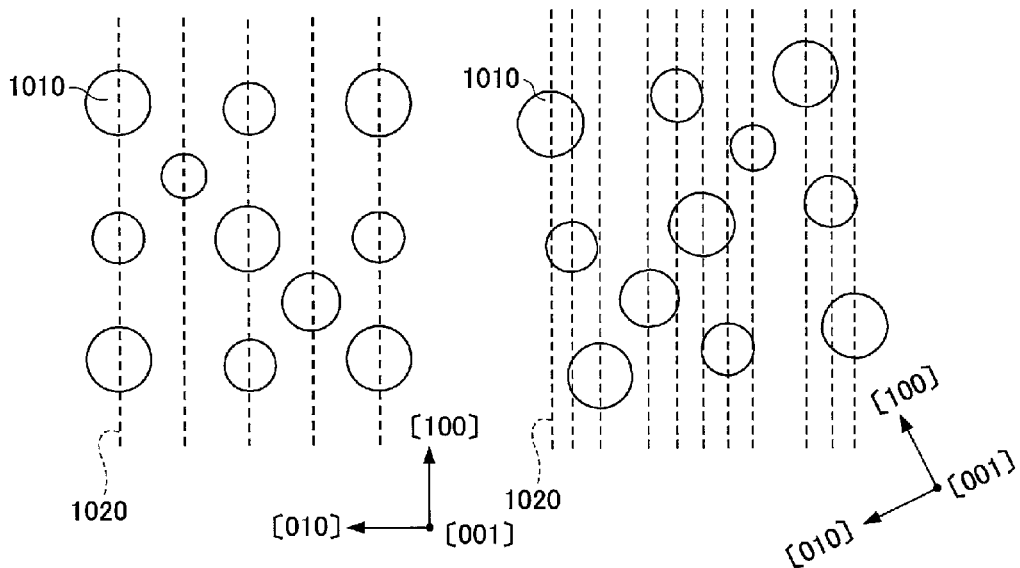
FIGS. 4A and 4B are diagrams showing an unit structure of a zinc blende type crystal.

The substrate 102 can be made of a zinc blende type single crystal. FIGS. 4A and 4B are diagrams showing a unit cell arrangement of the atoms 1010 constituting the zinc blende type crystal. In FIGS. 4A and 4B, the deeper from the sheet of the drawing the atom is located, the smaller the diameter of the atom is illustrated. FIG. 4A corresponds to the case which the off-angle is 0 degree, and FIG. 4B corresponds to the case which it is tilted from the (100) plane toward the direction at the off-angle of 26.6 degrees. Here, the off-angle denotes a tilt angle when it is tilted from a reference plane (e.g., a low-index plane) toward a predetermined direction. In the case which the off-angle is 26.6 degrees as shown in FIG. 4B, the crystal planes 1020 in the off-direction are arranged densely compared to the case which the off-angle is 0 degree as shown in FIG. 4A. In other words, by making the principal surface 103 as a plane tilted from the (100) plane toward the [010] direction, it becomes possible to make the crystal planes be arranged densely in the off-direction compared to other directions. The layers 104, 106, 108, 116 epitaxially-grown on the substrate 102 have substantially the same crystal structures as the substrate 102. Therefore, it is also possible to make the active layer 106 on the substrate 106 have the crystal planes arranged densely in the off-direction compared to other directions. In the example shown in FIGS. 4A and 4B, although the case which the off-angle is 26.6 degrees is explained, as long as the off-angle is in a range greater than 0 degree and not greater than 26.6 degrees, it is possible to arrange the crystal planes in the off-direction densely. It should be noted that although the case which the (100) plane is tilted is explained here, the same is applied to the case of tilting any other low-index planes. Further, in the case of tilting the (100) plane toward a direction other than the [010] direction, the off-direction is the direction which the crystal planes can be arranged densely compared to other directions in a similar manner.

The gain provided in the gain region while the light proceeding through is different depending on the density of the crystal planes of the active layer. Specifically, if the crystal planes are arranged densely in the light proceeding direction, the gain provided to the light is larger compared to the case which the crystal planes are sparsely arranged in the light proceeding direction. Therefore, it is possible that the off-direction is a direction which the gain provided to the light is larger compared to other directions in the active layer 106 on the substrate 102. Further, as an amount of the angle of the gain region with respect to the off-direction increases in a plan view, the gain provided to the light decreases. In the light emitting device 100, the planar shape of the first and the second gain regions 140, 142 can be axisymmetrical with each other about the perpendicular P parallel to the off-direction. In other words, the angle $\theta_1$ of the first gain region 140 with respect to the off-direction and the angle $\theta_2$ of the second gain region 142 with respect to the off-direction are the same amount. Therefore, the gain per unit length provided to the light proceeding through the first gain region 140 and that provided to the light proceeding through the second gain region 142 are equal to each other. Further, the length of the first gain region 140 and that of the second gain region 142 are equal to each other. Therefore, it is possible to make an amplification amount of the intensity of light in the first and the second gain regions 140, 142 equal to each other. Thus, in the light emitting device 100, the intensity of the first emitted light 20 and that of the second emitted light 22 can be identical to each other, and the polarization extinction ratios of the first and the second emitted light 20, 22 can be identical to each other. Further, since it is possible to reduce the amounts of the angles $\theta_1$, $\theta_2$ while keeping the amounts of the angles $\theta_1$, $\theta_2$ equal to each other, it is possible to obtain a high output power as a whole in the light emitting device 100.

As shown in FIGS. 1 and 3, the contact layer 110 is formed on the second cladding layer 108. As the contact layer 110, a layer having ohmic contact with the second electrode 114 can be used. As the contact layer 110, a p-type GaAs layer, for example, can be used.

The contact layer 110 and part of the second cladding layer 108 can form a columnar section 111. The planar shape of the columnar section 111 is, for example, the same as that of the gain regions 140, 142 as shown in FIG. 2. In other words, the current path between the electrodes 112, 114 is determined by the planar shape of the columnar section 111, for example, and as a result, the planar shapes of the gain regions 140, 142 are determined. It should be noted that although not shown in the drawings, the columnar section 111 can also be constituted with, for example, the contact layer 110, part of the second cladding layer 108, part of the active layer 106, and part of the first cladding layer 104. It should be noted that although not shown in the drawings, the side surfaces of the columnar section 111 can be inclined.

As shown in FIGS. 1 and 3, the insulating sections (also referred to as the insulating layer) 116 can be disposed on the second cladding layer 108 laterally to the columnar sections 111. The insulating sections 116 are contact with the side surfaces of the columnar sections 111. The upper surfaces of the insulating sections 116 can be contiguous to the upper surface of the contact layer 110. As the insulating section 116, for example, an SiN layer, an $SiO_2$ layer, and a polyimide layer can be used. If such materials are used as the insulating sections 116, the current between the electrodes 112, 114 can flow through the columnar sections 111 sandwiched between the insulating sections 116 avoiding the insulating sections 116. It is possible for the insulating sections 116 to have a refractive index smaller than that of the second cladding layer 108. In this case, the effective refractive index of the vertical cross section in which the insulating section 116 is provided becomes smaller than that of the vertical cross section in which the insulating section 116 is not provided, namely the columnar section 111 is provided. Thus, it becomes possible to efficiently confine the light inside the gain regions 140, 142 with respect to the planar direction. Further, it is also possible to eliminate the insulating sections 116. In other words, the insulating sections 116 can be an air. In this case, it is required to exclude the active layer 106 and the first cladding layer 104 from the columnar sections 111, or to prevent the second electrode 114 from being direct contact with the active layer 106 and the first cladding layer 104.

The first electrode 112 is formed on the entire bottom surface of the substrate 102. The first electrode 112 can be contact with the layer (the substrate 102 in the example shown in the drawings) having ohmic contact with the first electrode 112. Thus, the contact resistance of the first electrode 112 can be reduced. The first electrode 112 is electrically connected to the first cladding layer 104 via the substrate 102. The first electrode 112 is the one electrode for driving the light emitting device 100. As the first electrode 112, for example, stacking layers of a Cr layer, an AuGe layer, an Ni layer, and an Au layer in this order from the side of the substrate 102 can be used. It should be noted that it is also possible to dispose a second contact layer (not shown) between the first cladding layer 104 and the substrate 102, expose the second contact layer using a dry etching process, and then dispose the first electrode 112 on the second contact layer. Thus, a single-sided electrode structure can be obtained. This form is particularly effective in the case which the substrate 102 is an insulating member.

The second electrode 114 can be formed on the entire upper surface of the contact layer 110 (the columnar section 111) and the insulating sections 116. The second electrode 114 is electrically connected to the second cladding layer 108 via the contact layer 110. The second electrode 114 is the other electrode for driving the light emitting device 100. As the second electrode 114, for example, stacking layers of a Cr layer, an AuZn layer, and an Au layer in this order from the side of the contact layer 110 can be used. As shown in FIG. 2, the contact surface between the second electrode 114 and the contact layer 110 has a planar shape substantially the same as those of the gain regions 140, 142.

Although the case with the InGaAlP type is explained above as an example of the light emitting device 100 according to the present embodiment, any zinc blende type materials capable of forming a light emitting gain region can be used in the light emitting device 100. In the case of semiconductor materials, semiconductor materials such as an InP type, an InGaAsP type, a GaAs type, an InGaAs type, a GaInNAs type, a ZnCdSe type, a ZnSe type, BeZnSe type, ZnTe type, and BeZnTe type can be used.

The light emitting device 100 according to the present embodiment can be applied to the light source for a projector, a monitor display, an illumination device, an optical communication module, and a measuring device, for example.

The light emitting device 100 according to the present embodiment has the following features, for example.

According to the light emitting device 100, the laser oscillation of the light generated in the gain regions 140, 142 can be suppressed or prevented as described above. Therefore, the speckle noise can be reduced when it is used as a light source. Further, besides the application that the low speckle noise is preferable, in short-range optical communications such as coarse wavelength division multiplex (CWDM), which a wavelength width of several nanometers or greater is necessary for stable communication, the light emitting device 100 can also be available. Further, according to the light emitting device 100, the light generated in the gain regions 140, 142 can proceed in the gain regions 140, 142 while being provided with a gain, and then be emitted to outside. Therefore, it is possible to obtain a higher output power than that of a typical light emitting diode (LED) of the related art.

In the light emitting device 100, the planar shape of the first and the second gain regions 140, 142 can be axisymmetrical with each other about the perpendicular P parallel to the off-direction. Therefore, as described above, it is possible to make an amplification amount of the intensity of light in the first and the second gain regions 140, 142 equal to each other. Thus, in the light emitting device 100, the intensity of the first emitted light 20 can be identical to that of the second emitted light 22. Therefore, in case of using the light emitting device 100 for a light source of a projector or a monitor display, the luminance variation can be reduced. Further, since it is possible to reduce the amounts of the angles $\theta_1$, $\theta_2$ while keeping the amounts of the angles $\theta_1$, $\theta_2$ equal to each other, it is possible to obtain a high output power as a whole in the light emitting device 100.

In the light emitting device 100, it is possible to make the side surfaces 105, 107 of the active layer 106 the cleavage planes. Therefore, it is possible to preferably emit the light generated in the gain regions 140, 142 from the end surfaces 152, 156 on the second side surface 107, and to preferably reflect them on the end surfaces 154, 156 on the first side surface 105.

According to the light emitting device 100, part of the light 10 generated in the first gain region 140 is reflected by the overlapping plane 158, and can also proceed in the second gain region 142 while being provided with the gain. Further, the same can be applied to the part of the light generated in the second gain region 142. Therefore, according to the light emitting device 100, since the distance for amplifying the intensity of light becomes longer compared to the case which, for example, the light is not intentionally reflected by the overlapping plane 158, the high output power can be obtained.

2. Method of Manufacturing Light Emitting Device

Figure 6:
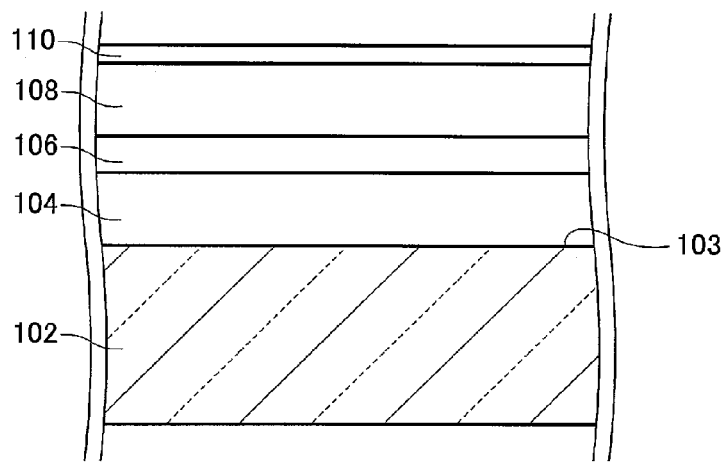
FIG. 6 is a cross-sectional view schematically showing a manufacturing process of the light emitting device according to the present embodiment.
Figure 7:
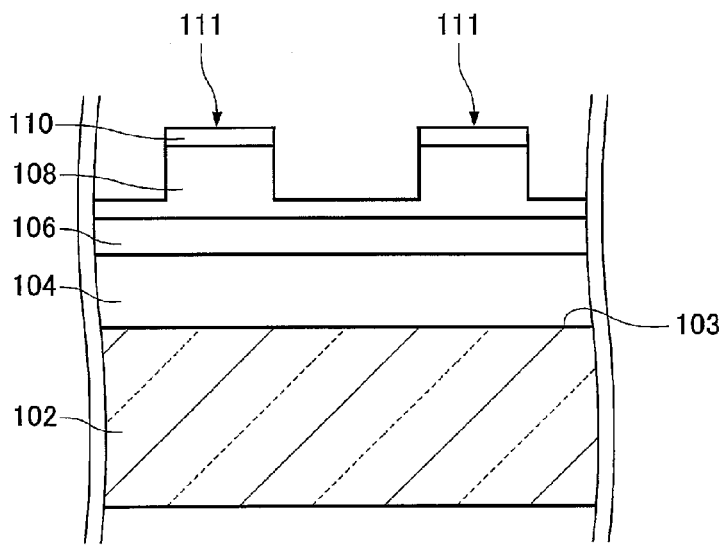
FIG. 7 is a cross-sectional view schematically showing the manufacturing process of the light emitting device according to the present embodiment.
Figure 8:
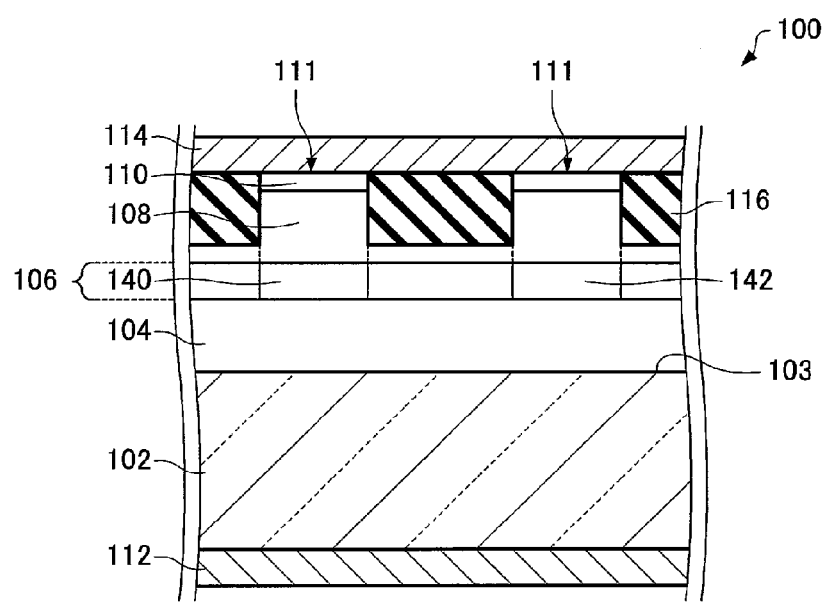
FIG. 8 is a cross-sectional view schematically showing the manufacturing process of the light emitting device according to the present embodiment.
Figure 9:
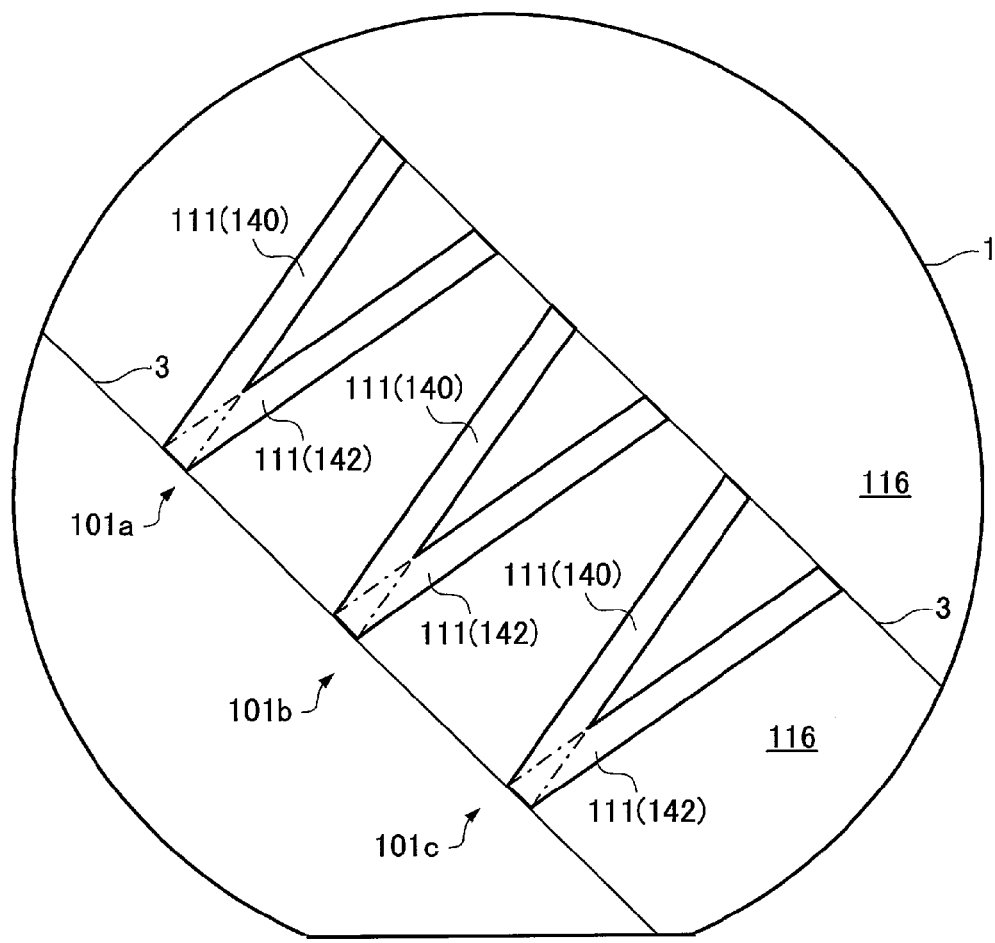
FIG. 9 is a plan view schematically showing the manufacturing process of the light emitting device according to the present embodiment.

Then, a method of manufacturing the light emitting device according to the present embodiment will be explained with reference to the accompanying drawings. FIGS. 6 through 8 are cross-sectional views schematically showing the manufacturing process of the light emitting device 100 according to the present embodiment, which correspond to FIG. 3. FIG. 9 is a plan view schematically showing the manufacturing process of the light emitting device 100 according to the present embodiment. It should be noted that in FIG. 9, the second electrode 114 is omitted from illustration for the sake of convenience.

As shown in FIG. 6, the first cladding layer 104, the active layer 106, the second cladding layer 108, and the contact layer 110 are grown epitaxially on the principal surface 103 of the substrate 102 in this order. As the method of growing these layers epitaxially, a metal organic chemical vapor deposition (MOCVD) method, a molecular beam epitaxy (MBE) method, and so on can be used.

As shown in FIG. 7, the contact layer 110 and the second cladding layer 108 are patterned by using, for example, a photolithography technology and an etching technology. According to the present process, the columnar sections 111 can be formed.

As shown in FIG. 8, the insulating sections 116 are formed so as to cover the side surfaces of the columnar sections 111. Specifically, an insulating layer (not shown) is formed firstly as a film above the second cladding layer 108 (including above the surface of the contact layer 110) using, for example, a chemical vapor deposition (CVD) method or a coating method. Subsequently, the upper surface of the contact layer 110 is exposed using, for example, a photolithography technology and an etching technology. According to the process described hereinabove, the insulating sections 116 can be formed.

Subsequently, the second electrode 114 is formed on the contact layer 110 and the insulating sections 116. The second electrode 114 is formed using, for example, a vacuum deposition method.

Subsequently, the first electrode 112 is formed under the bottom surface of the substrate 102. The manufacturing method of the first electrode 112 is, for example, the same as what is shown in the above example of the manufacturing method of the second electrode 114. It should be noted that the order of forming the first and the second electrodes 112, 114 is not particularly limited. According to the process described above, a plurality of light emitting patterns can be formed inside the wafer.

As shown in FIG. 9, scribing lines 3 for separating a plurality of light emitting patterns 101 (101a, 101b, 101c) are provided to a wafer 1 having the plurality of light emitting patterns 101. Although the number of light emitting patterns 101 is three in the example shown in the drawing, the number is not particularly limited. The scribing lines 3 are formed using, for example, a diamond cutter or a laser. The scribing lines 3 are formed parallel to the [001] direction. The light emitting device 100 can be obtained by cleaving the wafer 1 along with the scribing lines 3 to separate the light emitting patterns 101.

As shown in FIGS. 1 and 2, the reflective section 130 is formed on the entire surface on the side of the first side surface 105. The reflective section 130 is formed using, for example, a CVD method, a sputtering method, or an ion assisted deposition method.

According to the process described hereinabove, the light emitting device 100 can be manufactured.

According to the manufacturing method of the light emitting device 100, a novel light emitting device capable of reducing the speckle noise with high output power can be provided.

3. Modified Examples

Then, some modified examples of the light emitting device according to the present embodiment will be explained. It should be noted that in the modified example the points that is different from those of the example of the light emitting device 100 shown in FIGS. 1 through 3 will be explained, and the points that is substantially the same will be denoted with the same reference numerals and the explanation therefor will be omitted.

3-1. First Modified Example

Figure 10:
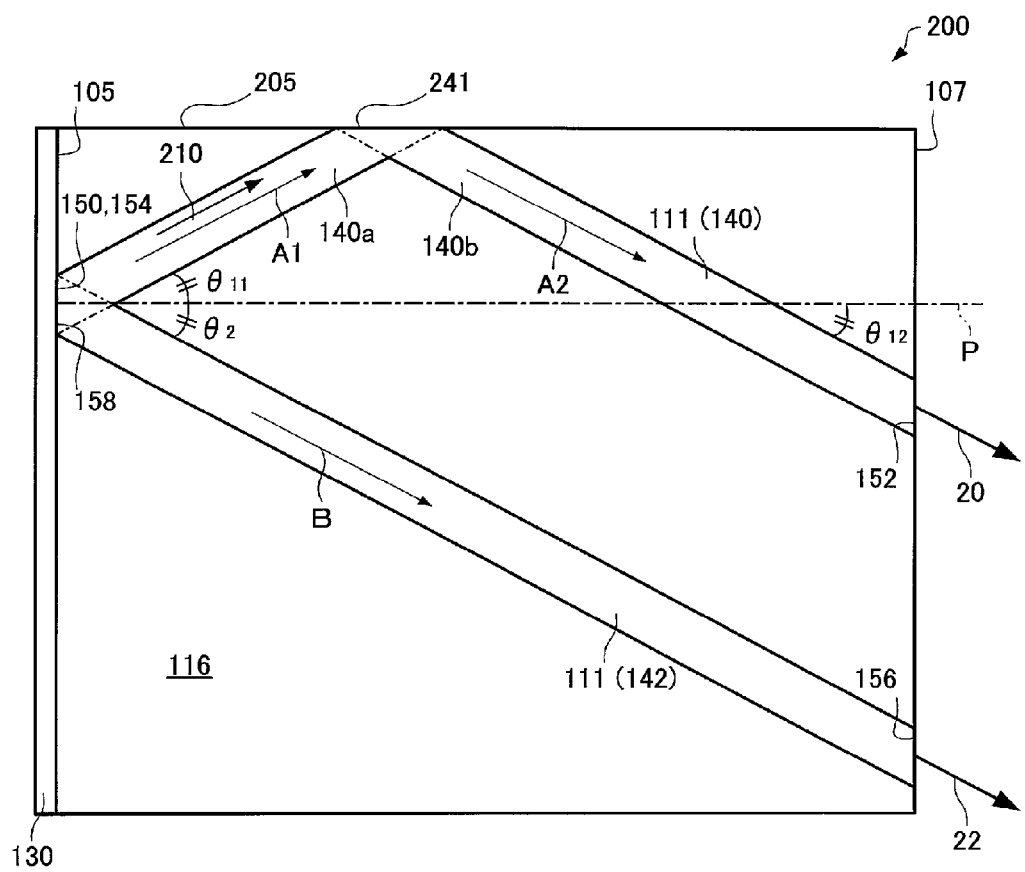
FIG. 10 is a plan view schematically showing a light emitting device according to a first modified example of the present embodiment.

Firstly, a first modified example will be explained. FIG. 10 is a plan view schematically showing the light emitting device 200 according to the present modified example. It should be noted that in FIG. 10, the second electrode 114 is omitted from illustration for the sake of convenience.

As shown in FIG. 10, in the light emitting device 200, the first gain region 140 is provided with a reflection surface 241 disposed between the first end surface 150 and the second end surface 152. In the example shown in the drawing, the reflection surface 241 is disposed on a third side surface 205 perpendicular to the first and the second side surfaces 105, 107 of the active layer 106. In the first gain region 140, the light 210 proceeding from the first end surface 150 to the reflection surface 241 can be reflected (e.g., totally reflected) by the reflection surface 241 to thereby proceed from the reflection surface 241 toward the second end surface 152. Subsequently, the light 210 can be emitted from the second end surface 152 as the first emitted light 20. In the example shown in the drawing, the first emitted light 20 and the second emitted light 22 can proceed in the same direction.

The first gain region 140 has a first part 140a disposed from the first side surface 105 to the third side surface 205, and a second part 140b disposed from the third side surface 205 to the second side surface 107. The shape of each of the first and the second part 140a, 140b is, for example, a trapezoid. As shown in FIG. 10, the first part 140a is disposed in the first direction A1 tilted toward one side at an angle $\theta_{11}$ with respect to the perpendicular P. The second part 140b is disposed in the second direction A2 tilted toward the other side at an angle $\theta_{12}$ with respect to the perpendicular P. In the example shown in the drawing, the angle $\theta_{11}$ and the angle $\theta_{12}$ are the same amount. Further, the angle $\theta_{11}$, the angle $\theta_{12}$, and the angle $\theta_2$ of the second gain region 142 with respect to the perpendicular P are the same amount. Here, the perpendicular P is parallel to the off-direction in a plan view. Therefore, the gain per unit length provided to the light proceeding through the first gain region 140 and that provided to the light proceeding through the second gain region 142 are equal to each other. Further, the length of the first and the second gain regions 140, 142 are equal to each other. Therefore, it is possible to make an amplification amount of the intensity of light in the first and the second gain regions 140, 142 equal to each other. Thus, it becomes possible that the intensity of the first emitted light 20 and that of the second emitted light 22 are identical to each other.

It should be noted that although not shown in the drawing, the reflection surface 241 can be provided only to the second gain region 142 instead of the first gain region 140, or can be provided to each of the gain regions 140, 142. Further, the third side surface 205 provided with the reflection surface 241 can also be provided with a reflecting section. Further, the reflection surface 241 can be disposed, for example, on the opening sections in the active layer 106 formed by etching instead of on the third side surface 205. Further, the first emitted light 20 and the second emitted light 22 can proceed in converging directions.

According to the light emitting device 200, the first emitted light 20 and the second emitted light 22 can proceed in the same direction. Thus, it becomes possible to miniaturize the optical system not shown (the optical system on which the emitted light 20, 22 incidents) compared to the case which, for example, the two emitted light beams proceed in diverging directions.

According to the light emitting device 200, as described above, it is possible to make an amplification amount of the intensity of light in the first and the second gain regions 140, 142 equal to each other. Thus, in the light emitting device 200, the intensity of the first emitted light 20 and the intensity of the second emitted light 22 can be identical to each other. Therefore, incase of using the light emitting device 200 for a light source of a projector or a monitor display, the luminance variation can be reduced.

3-2. Second Modified Example

Figure 11:
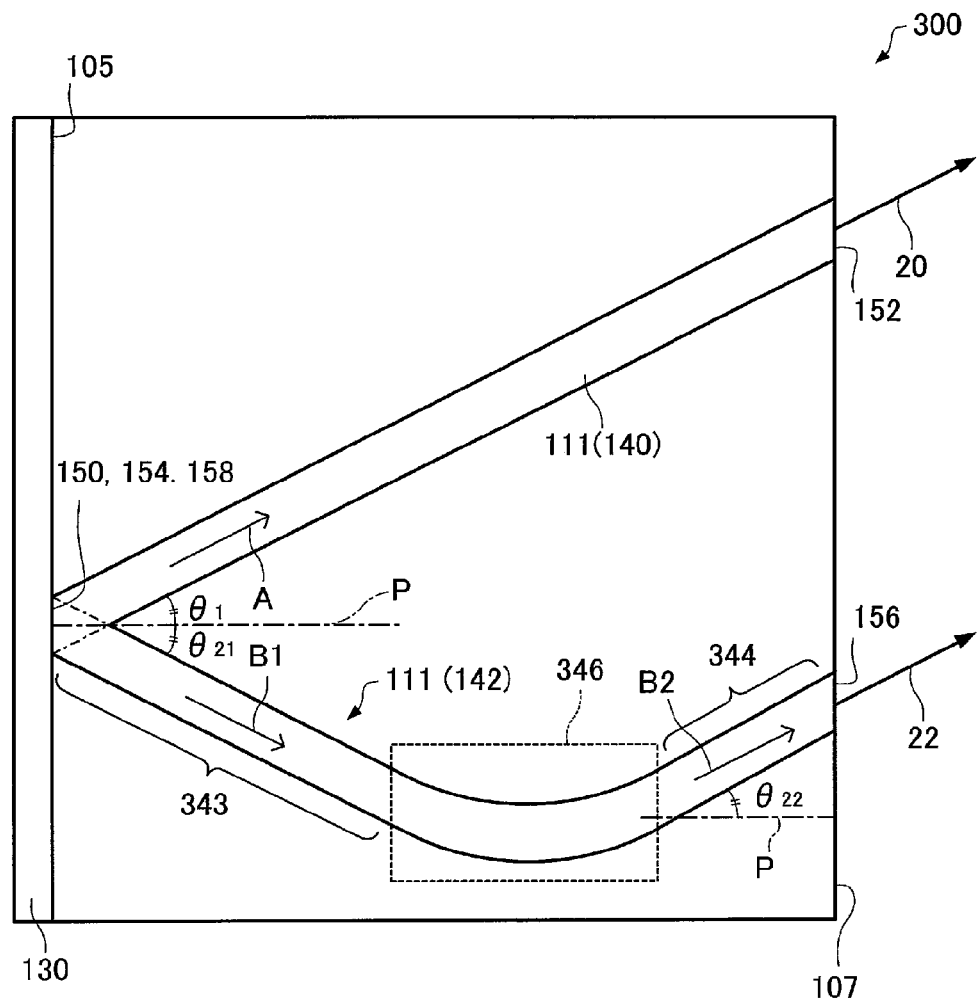
FIG. 11 is a plan view schematically showing a light emitting device according to a second modified example of the present embodiment.

Then, a second modified example will be described hereinafter. FIG. 11 is a plan view schematically showing the light emitting device 300 according to the present modified example. It should be noted that in FIG. 11, the second electrode 114 is omitted from illustration for the sake of convenience.

As shown in FIG. 11, in the light emitting device 300, the second gain region 142 is provided with a curved gain section 346 disposed between the third end surface 154 and the fourth end surface 156. The second gain region 142 can be provided with a first gain section 343, a second gain section 344, and the curved gain section 346.

As shown in FIG. 11, the first gain section 343 is linearly disposed from the third end surface 154 to the curved gain section 346 in a direction tilted with respect to the perpendicular P. The planar shape of the first gain section 343 is, for example, a parallelogram. The first gain section 343 and the first gain region 140 are disposed in directions different from each other. The first gain section 343 is disposed in a direction B1 tilted toward one side at an angle $\theta_{21}$ with respect to the perpendicular P in a plan view. The angle $\theta_{21}$ and the angle $\theta_1$ can be the same amount. Here, the perpendicular P is parallel to the off-direction in a plan view. Therefore, the gain per unit length provided to the light proceeding through the first gain section 343 and that provided to the light proceeding through the first gain region 140 can be equal to each other.

As shown in FIG. 11, the second gain section 344 is linearly disposed from the curved gain section 346 to the fourth end surface 156 in a direction tilted with respect to the perpendicular P. The planar shape of the second gain section 344 is, for example, a parallelogram. The second gain section 344 is disposed in a direction B2 tilted toward the other side at an angle $\theta_{22}$ with respect to the perpendicular P in a plan view. The second gain section 344 and the first gain region 140 can be disposed in the same direction. In other words, the angle $\theta_{22}$ and the angle $\theta_1$ can be the same amount. Therefore, the gain per unit length provided to the light proceeding through the second gain section 344 and that provided to the light proceeding through the first gain region 140 can be equal to each other.

The curved gain section 346 has a curved geometry such as an arc or an elliptical arc in a plan view. The curved geometry is not particularly limited providing it can smoothly connect the first gain section 343 and the second gain section 344 so that the light proceeding through the curved gain section 346 cannot be reflected. For example, a parabolic shape or a hyperbolic shape can be used. Thus, it becomes possible to bend the second gain region 142, and thereby to make the second emitted light 22 proceed in the same direction as the first emitted light 20. It should be noted that although a single curved gain section 346 is provided in the example shown in the drawing, the number of curved gain sections is not particularly limited. Further, it is also possible to make the first emitted light 20 and the second emitted light 22 proceed in converging directions. In the second gain region 142, the curved gain section 346 can prevent the light generated in the second gain region 142 from causing direct multiple reflection between the third end surface 154 and the fourth end surface 156. Since the curved gain section 346 includes an area having an amount of angle different from the amount of the angle $\theta_1$, the gain per unit length provided to the light proceeding through the curved gain section 346 and the gain per unit length provided to the light proceeding through the first gain region 140 may be different from each other in some cases.

Here, comparison with the case which the perpendicular of the first side surface is different from the off-direction in a plan view will be made. As another crystal orientation than the [010] direction which the first and the second side surfaces can be made the cleavage planes, for example, [011] direction and [01-1] direction can be cited. Here, comparison with the case which the perpendicular of the first side surface is parallel to the [011] direction in a plan view will be made. In the case which the perpendicular of the first side surface is parallel to the [011] direction in a plan view, the [010] direction has an angle of 45 degrees on one side with respect to the

[011] direction. Therefore, in case of making the perpendicular of the first side surface parallel to the [011] direction in a plan view, the angle of the first gain section with respect to the off-direction and the angle of the first gain region with respect to the off-direction become to have a different amount. Therefore, the gain per unit length provided to the light proceeding through the first gain section and that provided to the light proceeding through the first gain region are different from each other. As described above, in the case that the perpendicular of the first side surface is in a direction different from the off-direction, it is not achievable to make the gain per unit length in the first gain section and that in the first gain region equal to each other. In contrast thereto, since in the light emitting device 300, it is possible to make the gain per unit length in the first gain section 343 and that in the first gain region 140 equal to each other, the difference in amplification amount of the intensity of light between the first and the second gain regions 140, 142 can be reduced. Therefore, it is possible to make the intensity of the first emitted light 20 more close to that of the second emitted light 22 compared to the case which the perpendicular of the first side surface is different from the off-direction. Here, although the comparison with the case which the perpendicular of the first side surface is parallel to the [011] direction in a plan view is made, the same can be applied to the case which the first side surface is parallel to the [01-1] direction in a plan view.

The sum of the length of the first and the second gain sections 343, 344 can be larger than, for example, the length of the curved gain section 346. In other words, the length of a first gain portion (the first gain section 343 and the second gain section 344) having the tilt amount equal to the amount of tilt $\theta_1$ of the first gain region 140 with respect to the off-direction can be larger than the length of a second gain portion (the curved gain section 346) having the tilt amount different from the amount of tilt $\theta_1$ of the first gain region 140 with respect to the off-direction. Therefore, in the second gain region 142, since the influence of the gain provided in the curved gain section 346 on the light proceeding through the second gain region 142 is small, it is possible to make the intensity of the first emitted light 20 more close to that of the second emitted light 22. It should be noted that the length of the first and the second gain sections 343, 344 can be different from each other.

In the light emitting device 300 the second gain region 142 can be bent in a plan view by employing the curved gain section 346. Thus, it becomes possible to make the first and the second emitted light 20, 22 proceed in the same direction. Therefore, in the light emitting device 300, it is possible to make the emitted light 20, 22 proceed in the same direction without using, for example, a reflection surface provided to the side surface of the active layer using a cleavage process, or a reflection surface provided to the active layer using an etching process.

In the light emitting device 300, as described above, it is possible to reduce the difference between the amplification amount of the intensity of light in the first and the second gain regions 140, 142 compared to the case which the perpendicular of the first side surface is made parallel to a direction different from the off-direction. Thus, in the light emitting device 300 it is possible to make the intensity of the first emitted light 20 more close to that of the second emitted light 22 compared to the case, for example, the perpendicular of the first side surface is made parallel to a direction different from the off-direction.

3-3. Third Modified Example

Figure 12:
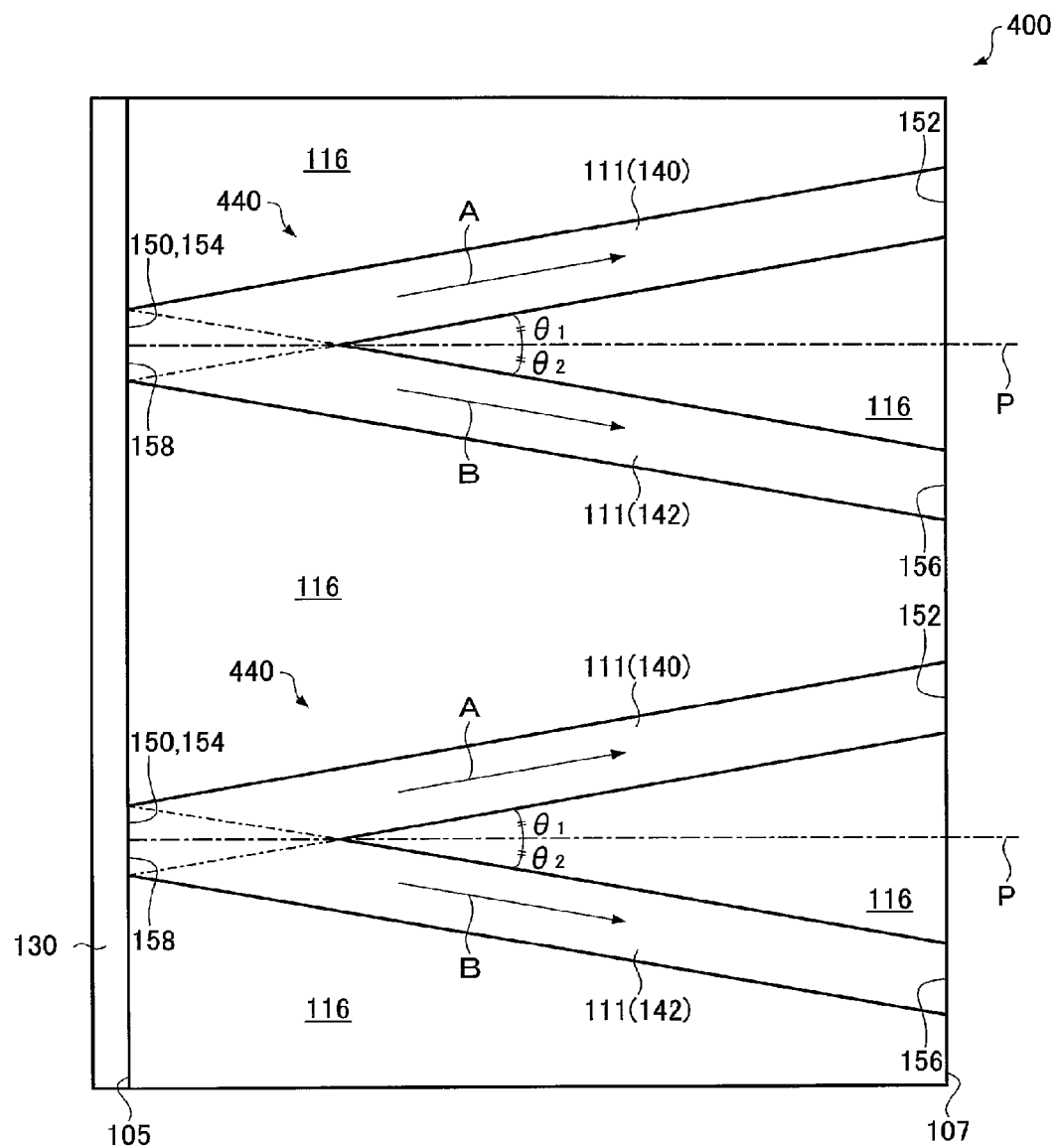
FIG. 12 is a plan view schematically showing a light emitting device according to a third modified example of the present embodiment.

Then, a third modified example will be described hereinafter. FIG. 12 is a plan view schematically showing the light emitting device 400 according to the present modified example. It should be noted that in FIG. 12, the second electrode 114 is omitted from illustration for the sake of convenience.

In the light emitting device 400 it is possible to arrange a plurality of pairs of gain regions 440 composed of the first gain region 140 and the second gain region 142. Although two pairs of gain regions 440 are arranged in the example shown in the drawing, the number of pairs is not particularly limited. Further, the planar shapes of the gain regions 140, 142 are not particularly limited, but can have the planar shapes explained in the examples of the light emitting device 200 and the light emitting device 300.

In the light emitting device 400, a higher output power can be achieved as a whole device compared to the example of the light emitting device 100.

3-4. Fourth Modified Example

Figure 13:
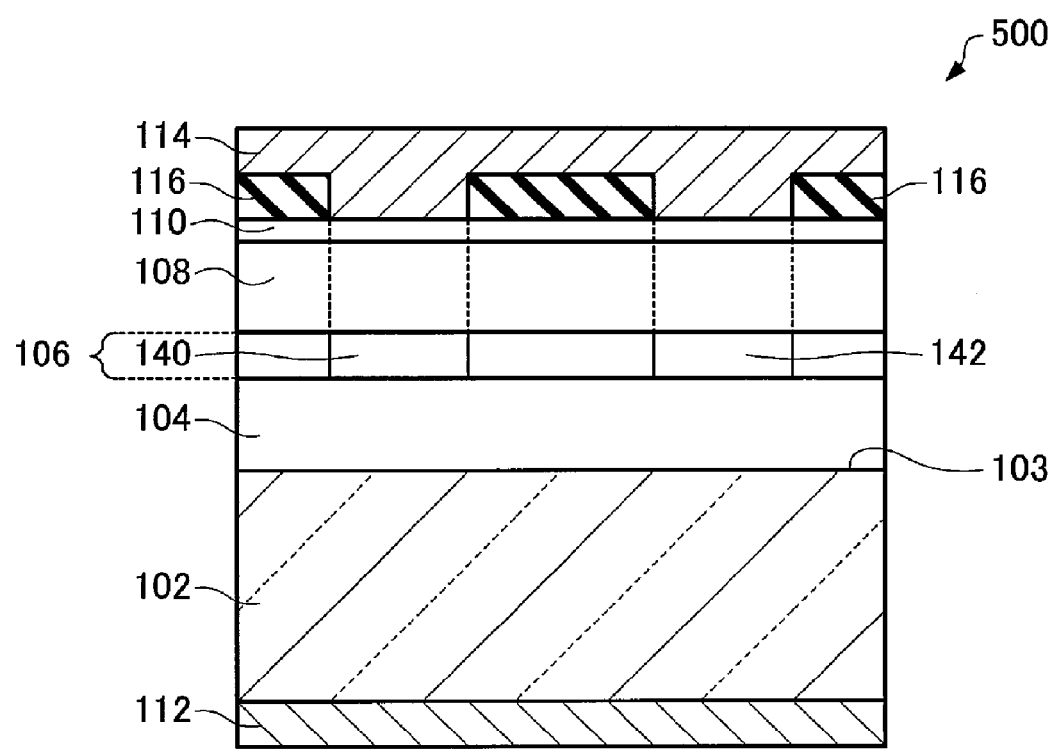
FIG. 13 is a cross-sectional view schematically showing a light emitting device according to a fourth modified example of the present embodiment.

Then, a fourth modified example will be explained hereinafter. FIG. 13 is a cross-sectional view schematically showing the light emitting device 500 according to the present embodiment, which corresponds to FIG. 3.

In the example of the light emitting device 100, there explained an index guiding type structure which a refractive index difference is provided in order to confine the light. Specifically, the refractive index difference is provided between the region which the insulating sections 116 is formed and the region which the insulating sections 116 is not formed, namely the region which the columnar section 111 is formed. In contrast thereto, in the present modified example it is possible to use a gain guiding type structure which the gain regions 140, 142 are directly used as the guiding regions without providing the refractive index difference by forming the columnar section 111.

Specifically, in the light emitting device 500, as shown in FIG. 13, the contact layer 110 and the second cladding layer 108 do not constitute the columnar section, and the insulating sections 116 are not formed on the side thereof. The insulating sections 116 are formed on the contact layer 110 except the area above the gain regions 140, 142. In other words, the insulating layer 116 has an opening section above each of the gain regions 140, 142, and the upper surface of the contact layer 110 is exposed in the opening section. The second electrode 114 is formed on the thus exposed section of the contact layer 110 and the insulating sections 116. The contact surface between the second electrode 114 and the contact layer 110 has the same planar shape as the gain regions 140, 142. In the example shown in the drawing, the current channel between the electrodes 112, 114 is determined by the planar shape of the contact surface between the second electrode 114 and the contact layer 110, and as a result, the planar shape of the gain regions 140, 142 can be determined. It should be noted that, although not shown in the drawing, it is also possible that the second electrode 114 is not formed on the insulating sections 116, but is formed only on the contact layer 110 above the gain regions 140, 142.

According to the present embodiment, a novel light emitting device similar to the light emitting device 100 described above and capable of reducing the speckle noise with a high output power can be provided.

It should be noted that the embodiment and the modified examples described above are each nothing more than an example, and the invention is not limited thereto. For example, it is also possible to arbitrarily combine the embodiment and the modified examples described above.

As described above, although the embodiment of the invention is explained in detail hereinabove, it should easily be understood by those skilled in the art that various modifications without substantially departing from the novel matters and the effects of the invention are possible. Therefore, such modified examples should be included in the scope of the invention.

The entire disclosure of Japanese Patent Application No. 2009-148611, filed Jun. 23, 2009 is expressly incorporated by reference herein.

What is claimed is:

1. A light emitting device comprising:
a substrate formed of a single crystal having a zinc blende structure, and having a plane tilted at a predetermined angle from a low-index plane as a principal surface;
a first cladding layer formed above the principal surface;
an active layer formed above the first cladding layer; and
a second cladding layer formed above the active layer,
wherein the active layer includes a first side surface and a second side surface parallel to the first side surface,
at least part of the active layer constitutes a first gain region and a second gain region,
a reflectance of the first side surface is higher than a reflectance of the second side surface in a wavelength region of light generated in the first gain region and the second gain region,
each of the first gain region and the second gain region is disposed from an end surface on the first side surface to an end surface on the second side surface,
at least part of the end surface of the first gain region located on the first side surface and part of the end surface of the second gain region located on the first side surface overlap with each other,
the end surface on the first side surface and the end surface on the second side surface fail to overlap with each other in a plan view from the first side surface side in each of the first gain region and the second gain region,
a perpendicular of the first side surface is parallel to an off-direction of the substrate in a plan view, and
a length of the first gain region and a length of the second gain region are equal to each other.

2. The light emitting device according to claim 1, wherein an amount of an angle of the first gain region with respect to the off-direction and an amount of angle of the second gain region with respect to the off-direction are equal to each other in a plan view.

3. The light emitting device according to claim 1, wherein the first gain region has a reflection surface adapted to reflect light proceeding through the first gain region, and disposed between the first side surface and the second side surface, and
light emitted from the end surface of the first gain region located on the second side surface and light emitted from the end surface of the second gain region on the second side surface proceed toward the same direction.

4. The light emitting device according to claim 3, wherein the reflection surface is disposed on a third side surface of the active layer perpendicular to the first side surface and the second side surface,
the first gain region has a first part disposed from the first side surface to the third side surface and a second part disposed from the third side surface to the second side surface, and
an angle of the first part with respect to the perpendicular of the first side surface, an angle of the second part with respect to the perpendicular of the first side surface, and an angle of the second gain region with respect to the perpendicular of the first side surface are the same in a plan view.

5. A light emitting device comprising:
a substrate formed of a single crystal having a zinc blende structure, and having a plane tilted at a predetermined angle from a low-index plane as a principal surface;
a first cladding layer formed above the principal surface;
an active layer formed above the first cladding layer; and
a second cladding layer formed above the active layer,
wherein the active layer includes a first side surface and a second side surface parallel to the first side surface,
at least part of the active layer constitutes a first gain region and a second gain region,
a reflectance of the first side surface is higher than a reflectance of the second side surface in a wavelength region of light generated in the first gain region and the second gain region,
each of the first gain region and the second gain region is disposed from an end surface on the first side surface to an end surface on the second side surface,
at least part of the end surface of the first gain region located on the first side surface and part of the end surface of the second gain region located on the first side surface overlap with each other,
the end surface on the first side surface and the end surface on the second side surface fail to overlap with each other in a plan view from the first side surface side in each of the first gain region and the second gain region,
a perpendicular of the first side surface is parallel to an off-direction of the substrate in a plan view, and
the second gain region includes
a first gain portion having a tilt amount equal to an amount of tilt of the first gain region with respect to the off-direction in a plan view, and
a second gain portion having a tilt amount different from the amount of tilt of the first gain region with respect to the off-direction in a plan view, and
a length of the first gain portion is larger than a length of the second gain portion.

6. The light emitting device according to claim 5, wherein the first gain region has a linear shape in a plan view,
the second gain region includes a curved gain section, and
light emitted from the end surface of the first gain region located on the second side surface and light emitted from the end surface of the second gain region on the second side surface proceed toward the same or converging directions.

7. The light emitting device according to claim 1, further comprising:
a first electrode electrically connected to the first cladding layer; and
a second electrode electrically connected to the second cladding layer,
wherein the first electrode is contact with a first layer having ohmic contact with the first electrode,
the second electrode is contact with a second layer having ohmic contact with the second electrode, and
at least one of a contact surface between the first electrode and the first layer and a contact surface between the second electrode and the second layer has a planar shape the same as a planar shape of the first gain region and the second gain region.

8. The light emitting device according to claim 1, wherein the first gain region and the second gain region form a pair of gain regions, and
a plurality of pairs of gain regions is disposed.

9. A light emitting device comprising:
a first electrode;
a substrate formed on the first electrode, the substrate being formed of a single crystal having a zinc blende structure, and having a plane tilted at a predetermined angle from a low-index plane as a principal surface;
a first cladding layer formed above the principal surface;
an active layer formed above the first cladding layer;
a second cladding layer formed above the active layer;
a contact layer formed on the second cladding layer; and
a second electrode formed on the contact layer such that the contact layer is disposed between the second cladding layer and the second electrode,
wherein the active layer includes a first side surface and a second side surface parallel to the first side surface,
at least part of the active layer constitutes a first gain region and a second gain region,
a reflectance of the first side surface is higher than a reflectance of the second side surface in a wavelength region of light generated in the first gain region and the second gain region,
each of the first gain region and the second gain region is disposed from an end surface on the first side surface to an end surface on the second side surface,
at least part of the end surface of the first gain region located on the first side surface and part of the end surface of the second gain region located on the first side surface overlap with each other,
the end surface on the first side surface and the end surface on the second side surface fail to overlap with each other in a plan view from the first side surface side in each of the first gain region and the second gain region,
a perpendicular of the first side surface is parallel to an off-direction of the substrate in a plan view, and
a length of the first gain region and a length of the second gain region are equal to each other.

* * * * *